(12) United States Patent
Hazan et al.

(10) Patent No.: US 9,701,011 B2
(45) Date of Patent: Jul. 11, 2017

(54) METHOD FOR ROBOTIC ENERGY SAVING TOOL SEARCH

(71) Applicant: Siemens Industry Software Ltd., Airport (IL)

(72) Inventors: Moshe Hazan, Elad (IL); Lisandro Embon, Petah Tikva (IL); Rahav Madvil, Rishon Lezion (IL)

(73) Assignee: Siemens Industry Software Ltd., Airport (IL)

( * ) Notice: Subject to any disclaimer, the term of this patent is extended or adjusted under 35 U.S.C. 154(b) by 591 days.

(21) Appl. No.: 14/272,972

(22) Filed: May 8, 2014

(65) Prior Publication Data

US 2015/0321349 A1    Nov. 12, 2015

(51) Int. Cl.
| | |
|---|---|
| G05B 19/4093 | (2006.01) |
| B25J 9/16 | (2006.01) |
| B23Q 3/155 | (2006.01) |
| B25J 15/00 | (2006.01) |
| G06F 17/50 | (2006.01) |

(52) U.S. Cl.
CPC ............ *B25J 9/16* (2013.01); *B23Q 3/155* (2013.01); *B25J 9/1661* (2013.01); *B25J 9/1671* (2013.01); *B25J 9/1679* (2013.01); *B25J 15/0019* (2013.01); *G05B 19/40938* (2013.01); *G05B 2219/32021* (2013.01); *G06F 17/5018* (2013.01); *Y02P 70/161* (2015.11); *Y02P 80/114* (2015.11); *Y02P 90/205* (2015.11);

(Continued)

(58) Field of Classification Search
None
See application file for complete search history.

(56) References Cited

U.S. PATENT DOCUMENTS

| | | | |
|---|---|---|---|
| 5,784,542 A | 7/1998 | Ohm et al. | |
| 6,004,016 A | 12/1999 | Spector | |

(Continued)

FOREIGN PATENT DOCUMENTS

| | | |
|---|---|---|
| DE | 102008027475 A1 | 12/2009 |
| DE | 102010052253 A1 | 5/2012 |

(Continued)

OTHER PUBLICATIONS

U.S. Appl. No. 14/448,416, Non-Final Office Action dated Aug. 25, 2015, 9 pages.

(Continued)

*Primary Examiner* — Isaac T Tecklu

(57) ABSTRACT

Systems and a method for robotic energy saving tool search. The systems and method include receiving inputs including one or more of robot information, tooling information, operation information, and position information. Using the information received, a list of tooling candidates of a robot required to complete one or more tasks for a complex operation and a task location for each of the one or more tasks in the complex operation is generated. Tooling candidate are then removed from the list of tooling candidates when the robot cannot reach every task location on a path required by the complex task. The path is adjusted to remove one or more collision events. The total energy consumption value for each remaining tooling candidate is calculated, and returning the tooling candidate with the lowest energy consumed.

20 Claims, 4 Drawing Sheets

(52) U.S. Cl.
CPC ............. *Y02P 90/26* (2015.11); *Y02P 90/265* (2015.11); *Y10S 901/41* (2013.01)

(56) References Cited

U.S. PATENT DOCUMENTS

| | | | |
|---|---|---|---|
| 6,216,058 | B1 | 4/2001 | Hosek et al. |
| 6,493,607 | B1 | 12/2002 | Bourne et al. |
| 6,728,599 | B2 | 4/2004 | Wang et al. |
| 7,298,385 | B2* | 11/2007 | Kazi ............... B25J 9/1671 345/633 |
| 7,386,365 | B2 | 6/2008 | Nixon |
| 8,401,698 | B2 | 3/2013 | Kamrani et al. |
| 8,447,455 | B2 | 5/2013 | Matsunaga |
| 8,620,473 | B2 | 12/2013 | Diolaiti et al. |
| 9,057,621 | B2 | 6/2015 | Tate et al. |
| 2004/0111183 | A1 | 6/2004 | Sutherland et al. |
| 2005/0055132 | A1 | 3/2005 | Matsumoto et al. |
| 2005/0137648 | A1 | 6/2005 | Cosendai et al. |
| 2005/0197680 | A1 | 9/2005 | DelMain et al. |
| 2006/0025890 | A1 | 2/2006 | Nagatsuka et al. |
| 2006/0145647 | A1 | 7/2006 | Kitatsuji et al. |
| 2006/0217841 | A1 | 9/2006 | Matsumoto et al. |
| 2006/0287769 | A1 | 12/2006 | Yanagita et al. |
| 2008/0009971 | A1 | 1/2008 | Kim et al. |
| 2008/0306628 | A1 | 12/2008 | Ng-Thow-Hing et al. |
| 2009/0105880 | A1 | 4/2009 | Okazaki |
| 2010/0224022 | A1 | 9/2010 | Choi et al. |
| 2010/0305751 | A1 | 12/2010 | Nagatsuka et al. |
| 2011/0153080 | A1 | 6/2011 | Shapiro et al. |
| 2012/0158174 | A1 | 6/2012 | Moon et al. |
| 2012/0165982 | A1 | 6/2012 | Kim et al. |
| 2012/0290131 | A1* | 11/2012 | Khoukhi ........... B25J 9/1623 700/250 |
| 2013/0030569 | A1 | 1/2013 | Fudaba et al. |
| 2013/0116822 | A1 | 5/2013 | Athohira |
| 2014/0005804 | A1 | 1/2014 | Brand |
| 2014/0156068 | A1 | 6/2014 | Graca et al. |
| 2014/0163736 | A1* | 6/2014 | Azizian ........... A61B 19/2203 700/259 |
| 2014/0207837 | A1 | 7/2014 | Taniguchi et al. |
| 2014/0257558 | A1* | 9/2014 | Frische ........... B25J 9/1664 700/245 |
| 2015/0148952 | A1 | 5/2015 | Shiratsuchi |
| 2015/0177194 | A1 | 6/2015 | Xu et al. |
| 2015/0278404 | A1* | 10/2015 | Embon ........... G06F 17/5009 703/13 |
| 2015/0278406 | A1* | 10/2015 | Embon ........... G06F 17/3053 703/13 |

FOREIGN PATENT DOCUMENTS

| | | |
|---|---|---|
| EP | 1090723 A2 | 4/2001 |
| EP | 2157490 A1 | 2/2010 |
| EP | 2485875 B1 | 4/2013 |
| JP | 2004243461 A | 9/2004 |
| JP | 2006192554 A | 7/2006 |
| WO | 2005049284 A1 | 6/2005 |
| WO | 2005124486 A2 | 12/2005 |
| WO | 2011042293 A1 | 4/2011 |
| WO | 2014052286 A1 | 4/2014 |

OTHER PUBLICATIONS

U.S. Appl. No. 14/197,620, Final Office Action dated Jul. 31, 2015, 16 pages.
Gasparetto et al. "Trajectory Planning in Robotics," Mathematics in Computer Science, vol. 6, No. 3, Aug. 30, 2012 pp. 269-279, XP035125437, 11 pages.
Vergnano, Alberto et al. "Modeling and Optimization of Energy Consumption in Cooperative Multi-Robot Systems" IEEE Transactions on Automation Science and Engineering, vol. 9. No. 2, Apr. 2012, 6 pages.
Diaz, Nancy et al. "Cost and Energy Consumption Optimization of Product Manufacture in a Flexible Manufacturing System" Laboratory for Manufacturing and Sustainability, University of California at Berkeley, USA, 8 pages.
EP Search Report dated May 27, 2016, for EP Application 15165205.4, 8 pages.
Ahuactzin, J., et al., "Using Genetic Algorithms for Robot Motion Planning," Proceedings of the 10th European Conference on Artificial Intelligence, 1992, 5 pages.
Bernhardt, R., et al., "Development of Virtual Robot Controllers and Future Trends," 6th IFAC Symposium on Cost Oriented Automation, Berlin, Germany, Oct. 8-9, 2001, 7 pages.
Bernhardt, R., "Von Realistischer Roboter Simulation Zu Virtuellen Steuerungen," ZWF, Zeitschrift fur Wirtschaftlichen Fabrikbetrieb, 2000, Munich, 5 pages. ( No translation).
Bernhart, R., et al., "Realistic Robot Simulation in Concurrent Engineering of Manufacturing Lines in Automative Industries," Eight ISPE International Conference on Concurrent Engineering : Research and Applications, Jul. 29-Aug. 1, 2002, 5 pages.
Bernhardt, R., et al., "The Virtual Robot Controller (VRC) Interface," ISATA 2000, Automation and Transportation Technology Simulation and Virtual Reality, Dublin Ireland, Sep. 25-27, 2000, 6 pages.
Bernhardt, R., et al., "Virtual Robot Controller (VRC) Interface," Robotik, 2000, 7 pages. ( No Translation).
Bernhart, R., et al., "Virtual Robot Controller as Simulation Agents," 2nd Workshop on Agent Based Simulation, ISBN 1-56555-215-6, Passau, Germany, Apr. 2-4, 2001, 6 pages.
Bohlin, R., et al., "Path Planning Using Lazy PRM," Proceedings of the 2000 IEEE International Conference on Robotics and Automation, San Francisco, CA, USA, Apr. 2000, pp. 521-528.
Chen, P., et al. "SANDROS: A Motion Planner with Performance Proportional to Task Difficulty," Proceedings of the 1992 IEEE International Conference on Robotics and Automation, Nice, France, May 1992, 8 Pages.
Faverjon, B., et al., "The Mixed Approach for Motion Planning: Learning Global Strategies from a Local Planner," Proceedings of the International Joint Conference on Artifical Intelligence, Jan. 1, 1987, 7 pages.
Gueta, L., et al., "Compact Design of Work Cell with Robot Arm and Positioning Table Under a Task Completion Time Constraint," 2009 IEEE/RSJ International Conference on Intelligent Robots and Systems, St. Louis, MO, USA, Oct. 11-15, 2009, 7 pages.
Gueta, L., et al., "Practical Point-to-Point Multiple-Goal Task Realization in a Robot Arm with a Rotating Table," Advanced Robotics, vol. 25, No. 6-7, 2011, pp. 717-738.
Hein, B., et al., "Automated Generated Collision-Free Time Optimized Robot Movements in Industrial Environments Based on Rounding," Proceedings of the 4th IEEE International Symposium on Assembly and Task Planning, Fukuoka, Japan, May 28-29, 2001, pp. 110-115.
Hirakawa, A., "Trajectory Generation for Redundant Manipulators Under Optimization of Consumed Electrical Energy," Conference Record of the 1996 IEEE Industry Applications Conference—31st IAS Annual Meeting, IEEE Service Center, US, vol. 6, Oct. 6, 1996, XP010201236.
Hwang, Y,. et al., "Optimizing Robot Placement for Visit-Point Tasks" Proceedings of the AI and Manufacturing Research Planning Workshop, Albuquerque, NM, USA, Jun. 1996, 7 pages.
"Realistic Robot Simulation (RRS)," www.realistic-robot-simulation.org, Fraunhofer IPK, 2009, Retrieved Jul. 26, 2014, 4 pages.
Sanchez, G., et al., "Locally-Optimal Path Planning by Using Probabilistic Roadmaps and Simulated Annealing," Proceedings of IASTED International Conference on Robotics and Applicatiions, Oct. 1999, 6 pages.
Skiena, S., "Weighted Graph Algorithms," The Algorithm Design Manual, 2nd Ed., Chapter 6, London, England, Aug. 2008, 39 pages.
Tian, L., et al., "An Effective Robot Trajectory Planning Method Using a Genetic Algorithm," Mechatronics, vol. 14, 2004, pp. 455-470.

(56) References Cited

OTHER PUBLICATIONS

Willnow, C., et al., "Virtual Time Management of Virtual Robot Controllers," Modeling and Simulation 2001, 15th European Simulation Multiconference 2001, ESM' 2001, Jun. 6-9, 2001, Prague, Czech Republic, 8 pages.

Yue, S., et al., "Point-to-Point Trajectory Planning of Flexible Redundant Robot Manipulators Using Genetic Algorithms," to appeal in Robotica, Trajectory Planning of FRM, Jul. 17, 2001, pp. 1-24.

Foreign Communication From a Related Counterpart Application, PCT Application No. PCT/US2013/061340, International Search Report dated Jan. 31, 2014, 16 pages.

Foreign Communication From a Related Counterpart Application, PCT Application No. PCT/US2014/021801, International Search Report dated Sep. 3, 2014, 13 pages.

Cao, Bailin et al. "Practical Implementation of Time-efficient Trajectory Planning for Two Cooperative Industrial Robot Arms", Proceedings of the 1996 IEEE/RSJ International Conference on Robots and Systems (IROS). Robotic Intelligence Interacting with Synamic Worlds, Osaka, Nov. 4-8, 1996, XP000771580, ISBN: 978-0-7803-3214-0, 8 pages.

Wang, Fei-Yue et al. "Planning Time-Optimal Trajectory for Coordinated Robot Arms", Proceedings of the International Conference on Robotics and Automation Atlanta, May 2-6, 1993, Los Alamitos, IEEE Comp. Soc. Press, US, vol. Conf. 10, May 2, 1993, XP010095120, ISBN; 978-0-8186-3450-5, 6 pages.

Baba N. et al: "Collision avoidance planning of a robot manipulator by using genetic algorithm—A consideration for the problem in which moving obstacles and/or several robots are included in the workspace"; Evolutionary Computation, 1994; IEEE World Congress on Computational Intelligence; First IEEE Conference Orlando, FL. USA Jun. 27-29, 1994; XP010122796; ISBN: 978-0-7803-1899-1, 6 pages.

\* cited by examiner

METHOD FOR ROBOTIC ENERGY SAVING TOOL SEARCH

TECHNICAL FIELD

The present disclosure is directed, in general, to computer-aided design, visualization, and manufacturing ("CAD") systems, product lifecycle management ("PLM") systems, product data management ("PDM") systems, and similar systems, that manage data for products and other items (collectively, "Product Data Management" systems or PDM systems).

BACKGROUND OF THE DISCLOSURE

Global trends of decreasing electricity consumption and reducing greenhouse gas emissions are leading to new standards and legislation. Energy efficient solutions are required desirable to avoid governmental fines and market disapproval.

PDM systems can be used for modeling manufacturing systems. Improved systems are desirable.

SUMMARY OF THE DISCLOSURE

Various disclosed embodiments include CAD and simulation methods and corresponding systems and computer-readable mediums. A method includes receiving inputs including one or more of robot information, operation information, and position information. The method includes generating a list of tooling candidates of a robot. The method includes, for each tooling candidate, determining an energy consumption value of the tooling candidate. The method includes, for each tooling candidate, determining a ranking for the tooling candidate based on the energy consumption value. The method includes transmitting the optimal tooling of the robot based on the ranking of each tooling candidate.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Determining the most efficient tooling selection for a complex process requires consideration of numerous constraints including whether the robot can reach all task locations from a given robot position, whether any collisions occur with the robot and any objects within its environment, and calculating the total amount of energy required to perform the complex task, along with other considerations.

Robots can be heavy power consumers. Robots work repeatedly on one or more tasks for long hours and have complex powertrains that can include engines, transmissions, and so on. In a typical production line, there can be many robots, which further amplify these issues.

Applying this approach on every robot in a production line reduces the energy consumption resulting in reduced production costs. The reduced production costs come from finding optimal tooling for each robot in the production line to reduce overall energy consumption.

Figure 1:
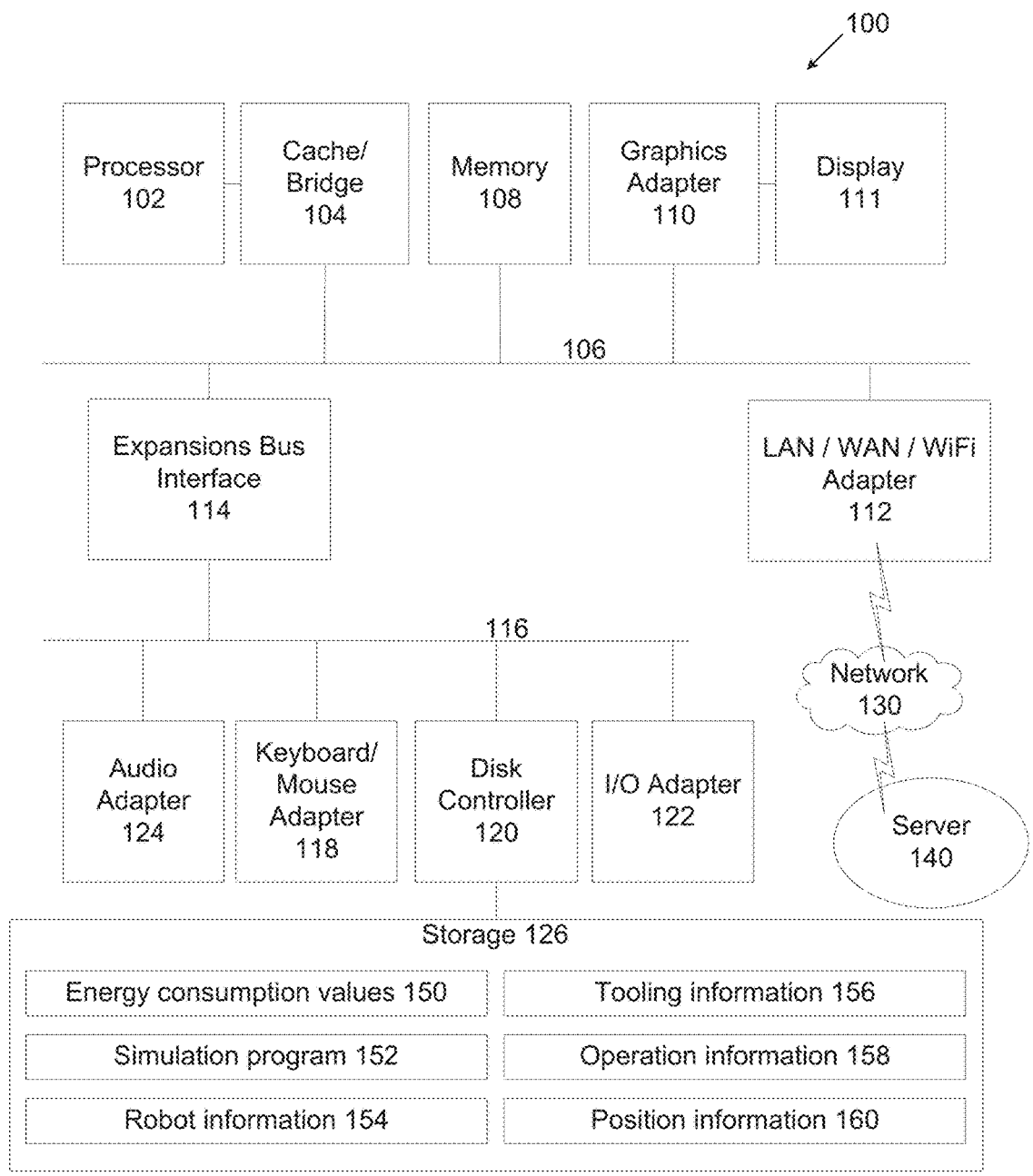
FIG. 1 illustrates a block diagram of a data processing system in which an embodiment can be implemented.

FIG. 1 illustrates a block diagram of a data processing system in which an embodiment can be implemented, for example as a PDM system particularly configured by software or otherwise to perform the processes as described herein, and in particular as each one of a plurality of interconnected and communicating systems as described herein. The data processing system illustrated can include a processor 102 connected to a level two cache/bridge 104, which is connected in turn to a local system bus 106. Local system bus 106 may be, for example, a peripheral component interconnect (PCI) architecture bus. Also connected to local system bus in the illustrated example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices. The storage 126 stores the energy consumption values 150, the simulation program 152, the robot information 154, the tooling information 156, the operation information 158, the position information 160, and so on, which are described below.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, touchscreen, etc.

Those of ordinary skill in the art will appreciate that the hardware illustrated in FIG. 1 may vary for particular implementations. For example, other peripheral devices, such as an optical disk drive and the like, also may be used in addition or in place of the hardware illustrated. The illustrated example is provided for the purpose of explanation only and is not meant to imply architectural limitations with respect to the present disclosure.

A data processing system in accordance with an embodiment of the present disclosure can include an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Figure 2:
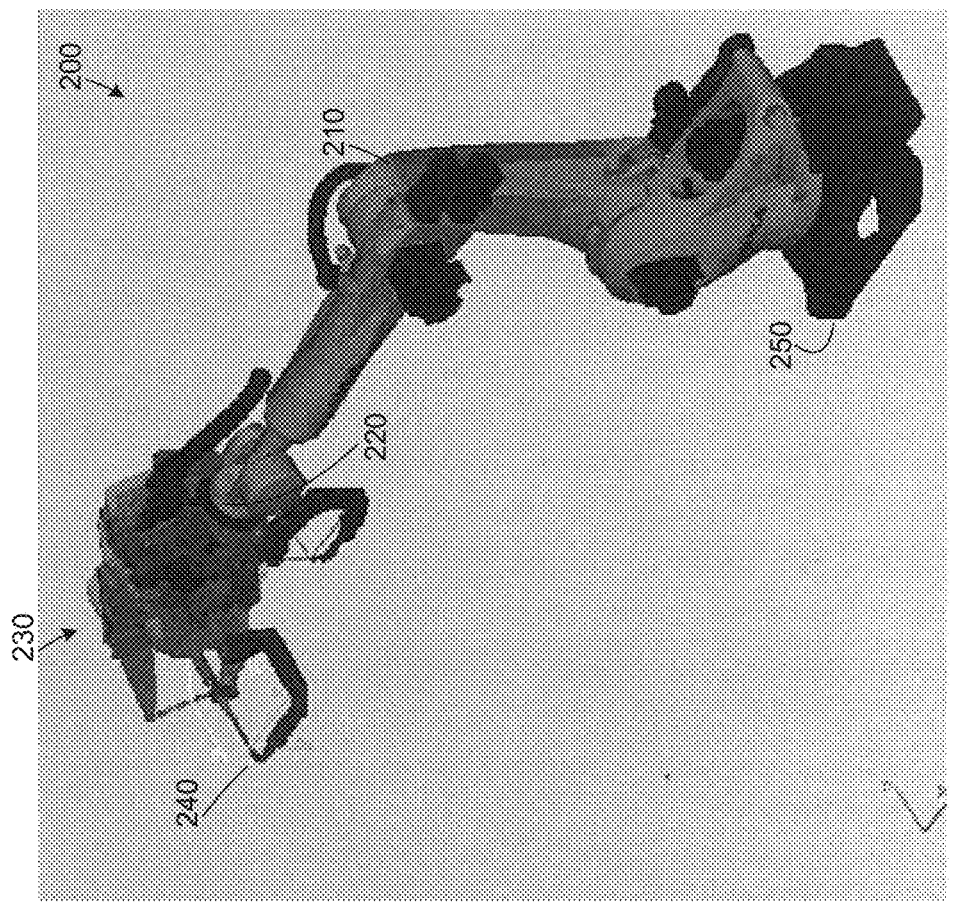
FIG. 2 illustrates a robot tooling candidate in accordance with the disclosed embodiments.

FIG. 2 illustrates a robot simulation in accordance with the disclosed embodiments. The simulated robot 200 depicted in FIG. 2 consists of a robotic arm 210 fixed at the base 250 to a position in a three-dimensional (3D) complex operation field. The robotic arm 210 moves and orients the tooling candidate 230 by rotating at multiple joints. The tooling candidates 230 connect to the robotic arm 210 at a connection point 220. The connection point 220 and method of connection may be different for each tooling candidate 230, possibly requiring a different fixed position in the 3D field and different adjustments of the robotic arm 210 in order to perform the tasks of the complex operation. FIG. 2 depicts the tooling candidate 230 as a welding unit, but the tooling candidate 230 can be a welding unit, riveting unit, soldering unit, cutting unit, or any other suitable tooling unit required for completing a complex operation.

Figure 3:
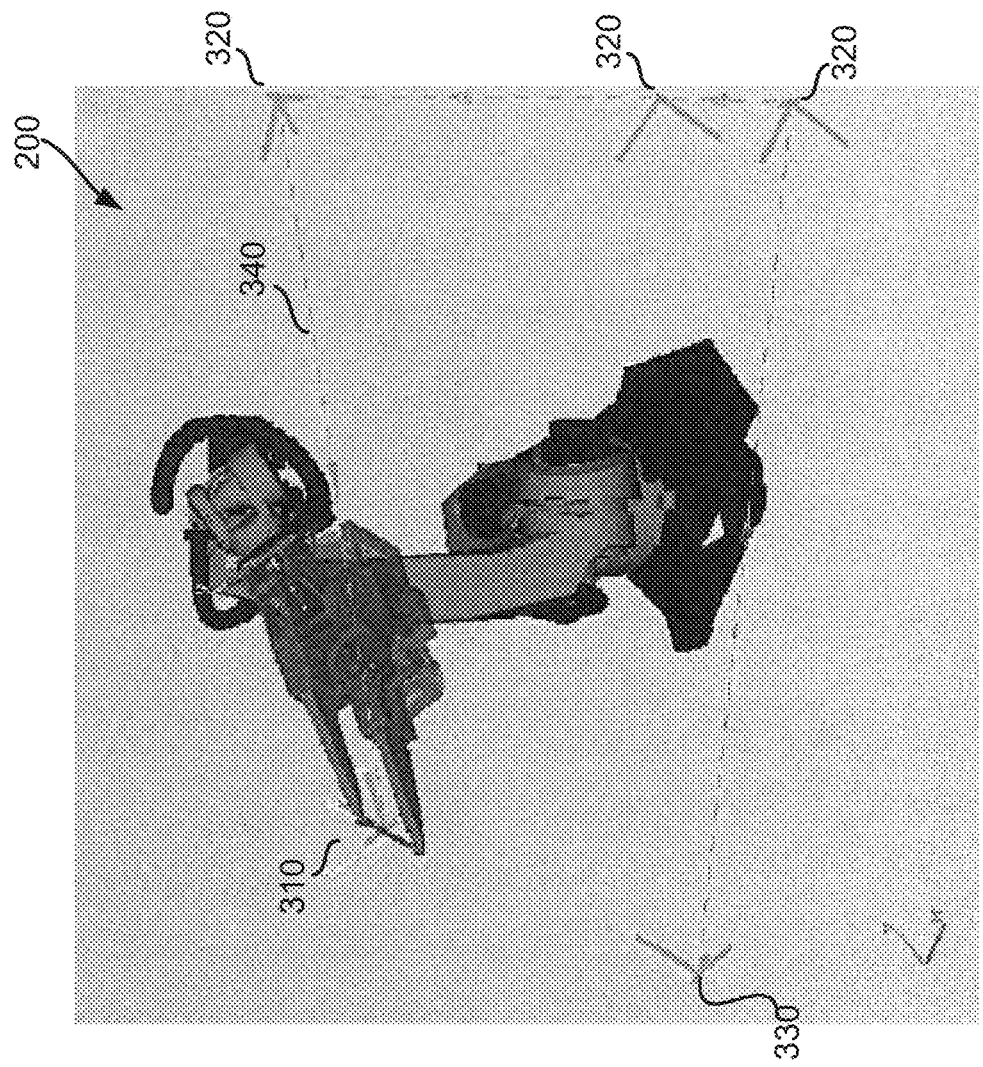
FIG. 3 illustrates a robot simulation along a path required by the complex operation in accordance with the disclosed embodiments.

FIG. 3 illustrates a robot simulation along a path required by the complex operation in accordance with the disclosed embodiments. The simulated robot 200 in FIG. 2 has the tooling candidate 230 located at the initial location 310 in the path 340 of the complex operation that also includes multiple intermediate task locations 320 and a final location 330. Based on a simulation, a tooling candidate 230 is set to perform a complex operation. The complex operation requires the tooling candidate to move along a path 340 starting at the initial location 320 and ending at the final location 330. The initial location and final location are depicted as different locations, but they could also be the same location. The initial location and final location might also be a task location or could just be a location not interfering with the insertion or removal of the product. Along the path are intermediate task locations 320, in which the tooling candidate 230 is required to perform additional tasks. The task locations along the path require the tooling candidates 230 to be oriented in a suitable manner to complete the task.

Figure 4:
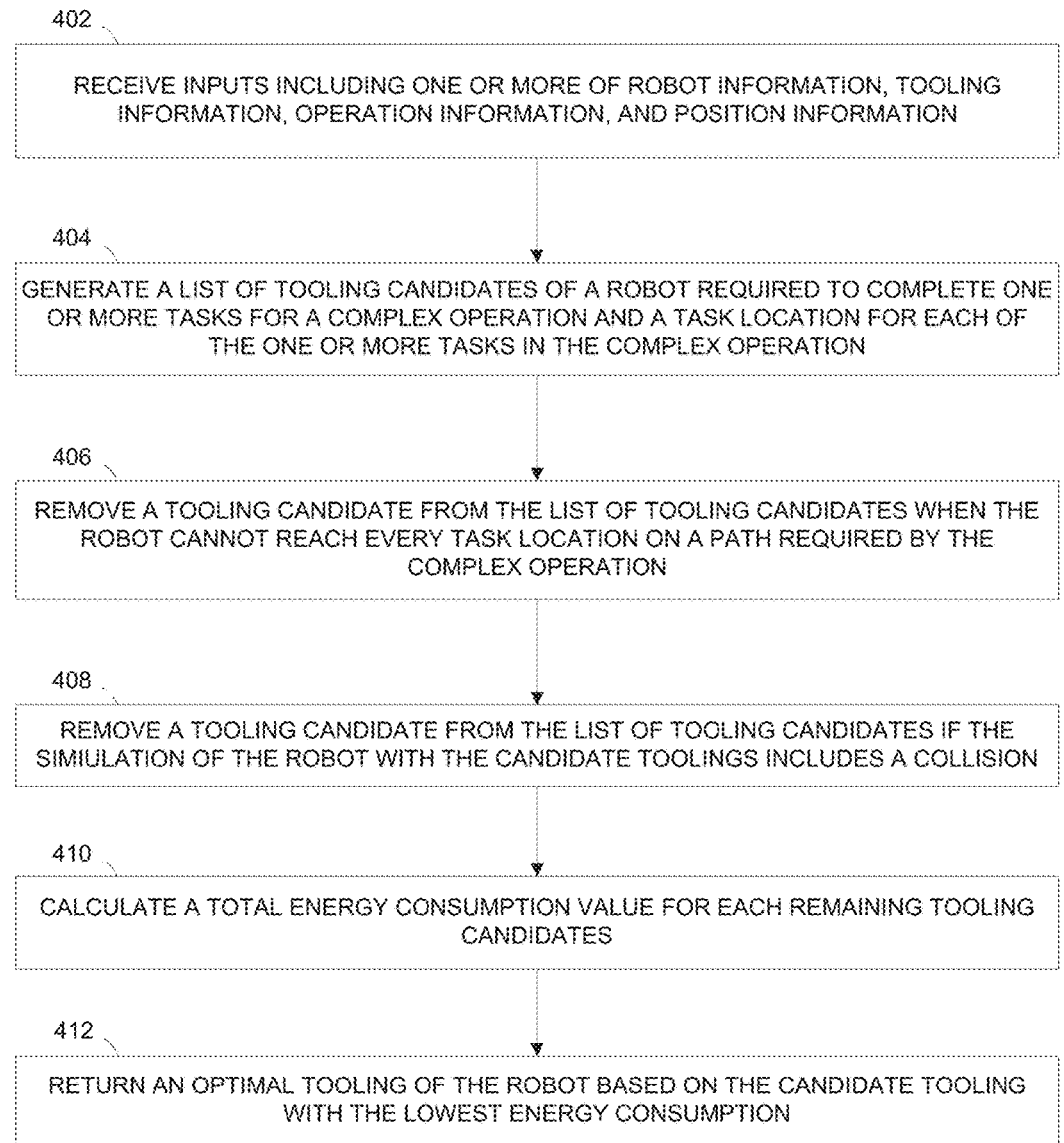
FIG. 4 illustrates a flowchart of a process to optimally tool a robot in accordance with disclosed embodiments.

FIG. 4 illustrates a flowchart of a process for optimally tooling a robot in accordance with disclosed embodiments. The energy consumption of the robot is realistic and accurate based on a realistic robot simulation (RRS) performed by a data processing system, such as the data processing system 100 of FIG. 1. The RRS interface is known to those of skill in the art, and is described at time of filing, for example, at realistic-robot-simulation.org. The system uses RRS simulation to accumulate the energy consumption for each one of the candidate tools and to find the collisions within the robot environment.

The system receives inputs including one or more of robot information 154, tooling information 156, operation information 158, and position information 160 (step 402). The robot information can include a model of the robot that allows for simulation of the movements of the robot. The robot information 154 also can include information related to the geometry or environment of the robot, the robot's surroundings, and any objects pertinent to the placement or location of the robot. The tooling information 156 can include a list of tooling candidates and specific information about each tooling candidate 230 including tooling orientation 240, connections, tooling weight, tool energy consumption values, and any other information concerning the different toolings required for the complex operation. The operation information 158 can include information on the complex operation that the robot is to perform, the initial position 310, a set of task locations 320 for the robot to reach to perform the complex operation, the final location 330, location orientation information, and any other operation related information. The position information 160 contains the robot's position. One or more of the processor 102, the memory 108, and the simulation program 152 running on the processor 102 receive the inputs via one or more of the local system bus 106, the adapter 112, the network 130, the server 140, the interface 114, the I/O bus 116, the disk controller 120, the storage 126, and so on. Receiving, as used herein, can include retrieving from storage 126, receiving from another device or process, receiving via an interaction with a user, or otherwise.

The system then generates a list of tooling candidates of the robot 200 comprising tooling candidates 230 from the tooling information 156 (step 404). The tooling candidates, which are capable of performing the function required to complete the tasks of the complex operation are added to the list of tooling candidates.

The system then creates the 3D complex operation field for running simulations of the robot with different tooling candidates 230. The location orientation information, including desired task orientation, the task orientation tolerance, and any other information required for reaching the task location, is added to the 3D complex operation field. The system generates a task location in the 3D complex operation field for each of the one or more task in the complex operation.

For each tooling candidate in the list of tooling candidates, the system runs an RRS simulation. The simulation uses the robot information 154, tooling information 156, the operation information 158, and the position information 160 to simulate performance of the complex operation by the robot with the tooling candidate 230. When running the simulation, the system removes each tooling candidate generated in the 3D complex operation space where the robot is not long enough or is otherwise unable to reach a task location on a path required to perform the complex operation when using that tooling candidate (step 406). In order for a tooling candidate to reach a task location, the tooling candidate 230 must not only extend to the location, but also must match a task location orientation of the tooling candidate for each task location. The correct tooling orientation 240 of the tooling candidate requires the tooling orientation 240 of the tooling candidate to be within the tolerance of the task orientation range. The tooling orientation 240 is based on the orientation of the tooling candidate mounted on the robot. The path can be adjusted for each tooling candidate based on a tooling orientation 240 of each tooling candidate connected to the robot.

While running the simulation for each tooling candidate 230, the system also determines if the simulation with the tooling candidate includes a collision and adjusts the path to remove one or more collision events (step 408). If the system cannot adjust the path to remove the one or more collision events, then the system removes the tooling candidate from the list of tooling candidates. In certain embodiments, the collision is removed by one or more of adding one or more flyby or additional non-task locations, changing the orientation of the task location, changing the configuration of the robot, and so on. Flyby locations are described, for example, in U.S. Patent Publication 2011/0153080 A1, which is hereby incorporated by reference.

The system calculates the energy consumption value by running a simulation with each tooling candidate attached to the robot arm (step 410). The energy consumption calculation may include the energy of the robot consumes to move the tooling to the task location as well as the energy consumption of the tooling. The energy consumption value indicates the amount of energy consumed by the robot in order to complete the complex operation with the tooling candidates attached to the robot arm for which the simulation was run. In certain embodiments, for each tooling candidate remaining in the list of tooling candidates, when the energy consumption value of the tooling candidate does not meet a threshold, the system removes the tooling candidate from the list of tooling candidates.

The system determines the optimal tooling of the robot based on best energy consumption, which generally is the lowest total energy consumption. Once an optimal tooling is determined, the optimal tooling is returned to the user (step 412).

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being illustrated or described herein. Instead, only so much of a data processing system as is unique to the present disclosure or necessary for an understanding of the present disclosure is illustrated and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for product data management, the method performed by a data processing system and comprising:
   receiving inputs including one or more of robot information, tooling information, operation information, and position information;
   generating a list of tooling candidates for a robot required to complete one or more tasks for a complex operation and a task location for each of the one or more tasks in the complex operation;
   removing a tooling candidate from the list of tooling candidates when the robot cannot reach every task location on a path required by the complex operation when using that tooling candidate;
   adjusting the path to remove one or more collision events;

calculating a total energy consumption value for each remaining tooling candidate; and operating the robot using an optimal tooling based on the tooling candidate with a lowest total energy consumption.

2. The method for product data management of claim 1, wherein the tooling information includes a tooling orientation based on an orientation of the tooling candidate mounted on the robot.

3. The method for product data management of claim 2, wherein reaching a task location requires the tooling orientation to match a task location orientation of the tooling candidate for each task location.

4. The method for product data management of claim 2, further comprising:

adjusting the path for each tooling candidate based on a tooling orientation of each tooling candidate connected to the robot.

5. The method for product data management of claim 4, wherein adjusting the path is based on determining the path with the lowest total energy consumption.

6. The method for product data management of claim 1, wherein the total energy consumption includes an energy consumption of the robot and an energy consumption of the tooling candidate.

7. The method for product data management of claim 1, further comprising:

removing a tooling candidate from the list of tooling candidates when the one or more collision events cannot be removed by adjusting the path.

8. A data processing system comprising:

a processor; and an accessible memory, the data processing system particularly configured to:

receive inputs including one or more of robot information, tooling information, operation information, and position information;

generate a list of tooling candidates of a robot required to complete one or more tasks for a complex operation and a task location for each of the one or more tasks in the complex operation;

remove a tooling candidate from the list of tooling candidates when the robot cannot reach every task location on a path required by the complex operation when using that tooling candidate;

adjust the path to remove one or more collision events;

calculate a total energy consumption value for each remaining tooling candidate;

operate the robot using an optimal tooling based on the tooling candidate with a lowest total energy consumption.

9. The data processing system of claim 8, wherein the tooling information includes a tooling orientation based on an orientation of the tooling candidate mounted on the robot.

10. The data processing system of claim 9, wherein reaching a task location requires the tooling orientation to match a task location orientation of the tooling candidate for each task location.

11. The data processing system of claim 9, further comprising:

adjust the path for each tooling candidate based on a tooling orientation of each tooling candidate connected to the robot.

12. The data processing system of claim 11, wherein to adjust the path is based on determining the path with the lowest total energy consumption.

13. The data processing system of claim 8, wherein the total energy consumption includes an energy consumption of the robot and an energy consumption of the tooling candidate.

14. The data processing system of claim 13, wherein the data processing system is further configured to:

remove a tooling candidate from the list of tooling candidates when the one or more collision events cannot be removed by adjusting the path.

15. A non-transitory computer-readable medium encoded with executable instructions that, when executed, cause one or more data processing systems to:

receive inputs including one or more of robot information, tooling information, operation information, and position information;

generate a list of tooling candidates of a robot required to complete one or more tasks for a complex operation and a task location for each of the one or more tasks in the complex operation;

remove a tooling candidate from the list of tooling candidates when the robot cannot reach every task location on a path required by the complex operation when using that tooling candidate;

adjust the path to remove one or more collision events;

calculate a total energy consumption value for each remaining tooling candidate; and operate the robot using an optimal tooling based on the tooling candidate with a lowest total energy consumption.

16. The non-transitory computer-readable medium of claim 15, wherein the tooling information includes a tooling orientation based on an orientation of the tooling candidate mounted on the robot.

17. The non-transitory computer-readable medium of claim 16, wherein reaching a task location requires the tooling orientation to match a task location orientation of the tooling candidate for each location.

18. The non-transitory computer-readable medium of claim 16, wherein the executable instructions, when executed, further cause the one or more data processing systems to:

adjust the path for each tooling candidate based on a tooling orientation of each tooling candidate connected to the robot.

19. The non-transitory computer-readable medium of claim 18, wherein to adjust the path is based on determining the path with the lowest total energy consumption.

20. The non-transitory computer-readable medium of claim 15, wherein the total energy consumption includes an energy consumption of the robot and an energy consumption of the tooling candidate.

* * * * *